US008203334B2

(12) United States Patent
Baller et al.

(10) Patent No.: US 8,203,334 B2
(45) Date of Patent: Jun. 19, 2012

(54) MAGNETICALLY SPIRALLY ENCODED SHAFT FOR MEASURING ROTATIONAL ANGEL, ROTATIONAL SPEED AND TORQUE

(75) Inventors: Marko Baller, Bavaria (DE); Christof Sihler, Bavaria (DE)

(73) Assignee: General Electric Company, Niskayuna, NY (US)

( * ) Notice: Subject to any disclaimer, the term of this patent is extended or adjusted under 35 U.S.C. 154(b) by 0 days.

(21) Appl. No.: 12/914,322

(22) Filed: Oct. 28, 2010

(65) Prior Publication Data
US 2011/0267045 A1 Nov. 3, 2011

(51) Int. Cl.
*G01B 7/30* (2006.01)
(52) U.S. Cl. ............. 324/207.25; 324/174; 324/207.21; 324/207.2; 73/862.325
(58) Field of Classification Search ............... 324/207.2, 324/207.21, 207.25, 174; 73/862.325, 862.321
See application file for complete search history.

(56) References Cited

U.S. PATENT DOCUMENTS

| 5,195,382 | A | 3/1993 | Peilloud | |
|---|---|---|---|---|
| 6,260,423 | B1 * | 7/2001 | Garshelis | 73/862.336 |
| 6,871,555 | B2 * | 3/2005 | May | 73/862.333 |
| 6,904,814 | B2 * | 6/2005 | May | 73/862.333 |
| 6,910,391 | B1 * | 6/2005 | May | 73/862.333 |
| 7,249,527 | B2 | 7/2007 | Desbiolles | |
| 7,631,564 | B1 | 12/2009 | Sihler | |
| 8,001,850 | B2 * | 8/2011 | Hedayat et al. | 73/862.333 |
| 2004/0196028 | A1 * | 10/2004 | Schroeder et al. | 324/207.22 |
| 2009/0007697 | A1 | 1/2009 | May | |
| 2009/0021244 | A1 | 1/2009 | May | |
| 2009/0219122 | A1 | 9/2009 | May | |
| 2009/0301223 | A1 | 12/2009 | Sihler | |
| 2009/0301224 | A1 | 12/2009 | Sihler | |

OTHER PUBLICATIONS

Dynamic, Highly Accurate, Industrial Torque Sensor, Quatras Product Description, Released Jun. 2008 by NCTEngineering, Germany.
Angle Sensor Design and Dimension Article, Jun. 2006, NCTEngineering, Germany.
Bending Sensor Design and Dimension Article, Aug. 2006, NCTEngineering, Germany.
Torque Sensor Design and Dimension Article, Feb. 2005, NCTEngineering, Germany.
Sasada, A Torque Sensor Using Magnetorestrictive Sleeve Attached to the Shaft by Shrink-Fit, IEEE Digests of the IEEE International Magnetics Conference, Apr. 4-8, 2005, pp. 435-436.

* cited by examiner

*Primary Examiner* — Jay Patidar
(74) *Attorney, Agent, or Firm* — Ann M. Agosti

(57) ABSTRACT

A magnetically spirally encoded shaft and magnetic field detecting system includes first, second, third and fourth magnetically encoded bands spirally encircling a circumference of the shaft. Each band includes first magnetically encoded regions having a first magnetic polarity alternating with second magnetically encoded regions having a second magnetic polarity. Dead zones are defined in each band between successive first and second magnetically encoded regions. The shaft is for use with a first fixed magnetic field sensor for detecting magnetic fields in the force-sensitive regions, wherein one or more of rotational speed, shaft rotational position, bending forces, torque forces, stress forces and strain forces can be determined responsive to detected magnetic fields.

17 Claims, 11 Drawing Sheets

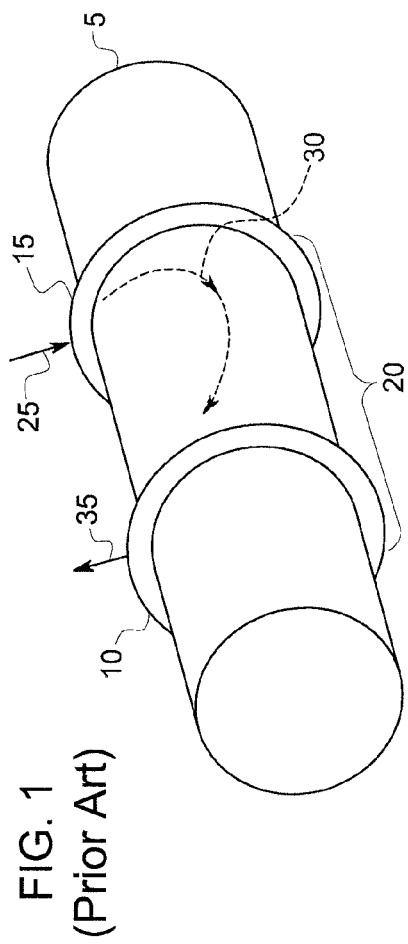
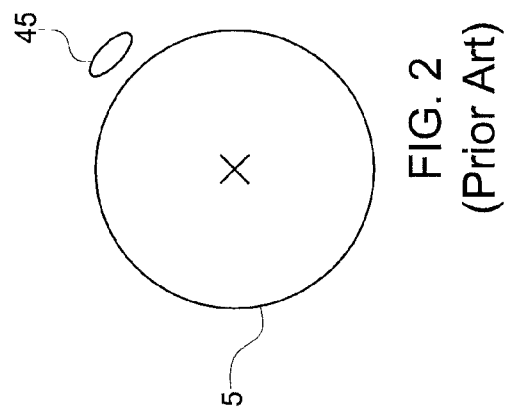
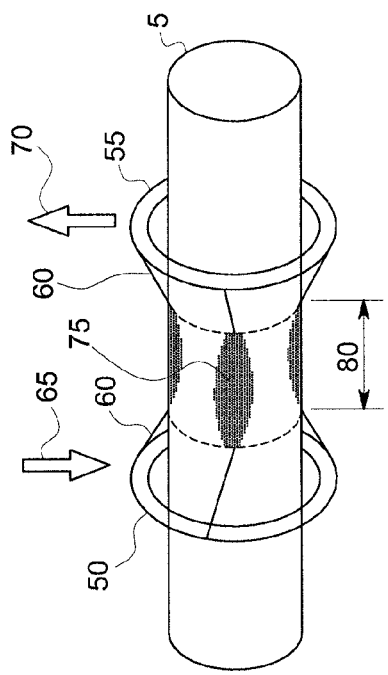
FIG. 1 (Prior Art)
FIG. 2 (Prior Art)
FIG. 3 (Prior Art)

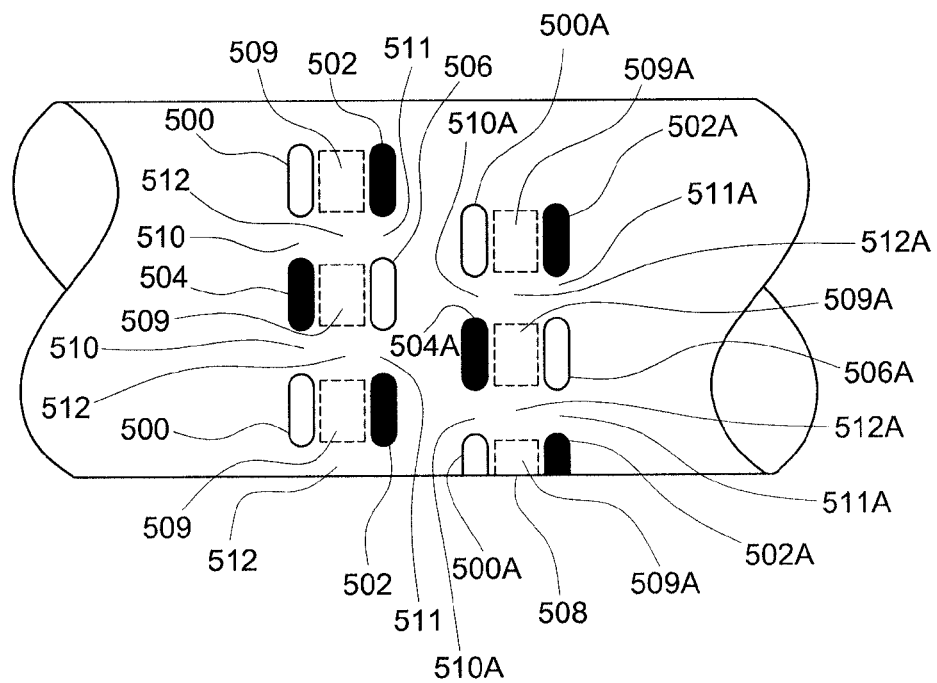
FIG. 17
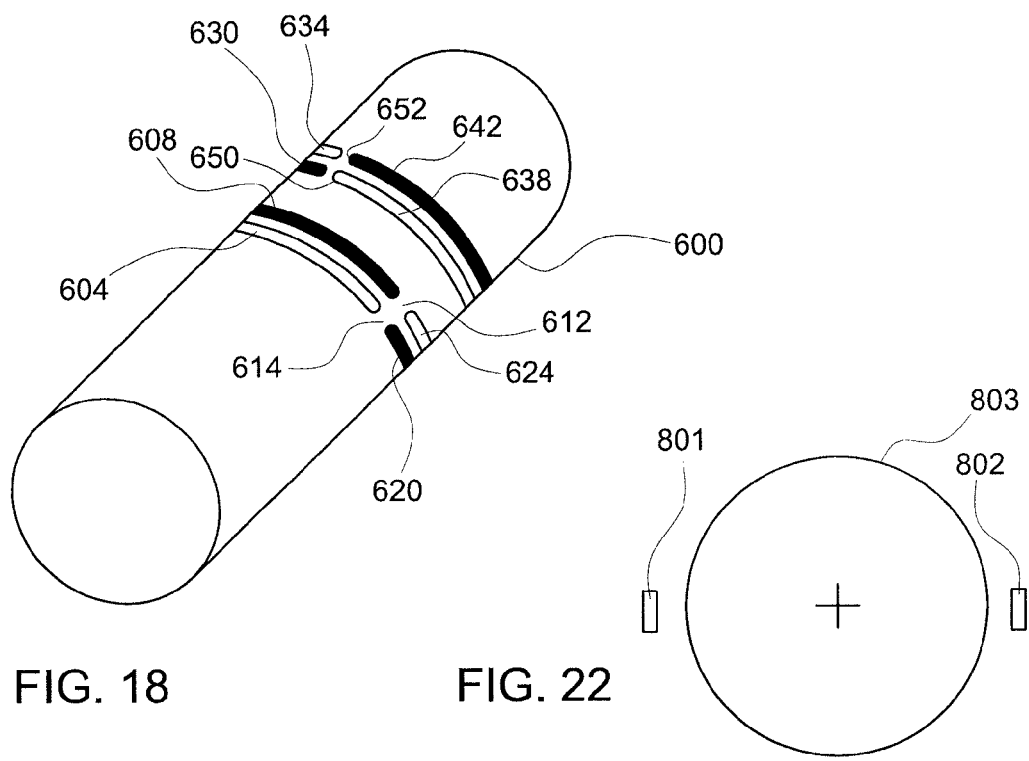
FIG. 18
FIG. 22

MAGNETICALLY SPIRALLY ENCODED SHAFT FOR MEASURING ROTATIONAL ANGEL, ROTATIONAL SPEED AND TORQUE

RELATED APPLICATION

The present invention is related to U.S. patent application Ser. No. 12/914,344, titled "Method and Apparatus for Continuous Sectional Magnetic Encoding to Measure Torque on Large Shafts", assigned in common to the same assignee of the present invention, filed concurrently herewith and incorporated herein by reference in its entirety.

FIELD

This invention relates generally to magnetic encoding of a shaft and in particular to an apparatus and method for sectional encoding of the shaft for use in determining one or more of rotational angle, rotational speed, bending moments and torque, especially on large shafts.

BACKGROUND

Sustainable energy sources, for example wind turbines, are gaining widespread popularity due to increased energy demands and the desire to reduce consumption of natural resources.

A typical wind turbine comprises a plurality of rotor blades, located atop a high tower, for converting the wind energy to rotational energy for driving a main shaft. The main shaft is coupled to an electric generator either directly or through a gearbox (transmission). The gearbox converts low speed wind-driven rotation to high speed rotation as required for driving the generator to generate electricity. The wind turbine also includes a structural support component, such as a tower, and a rotor pointing mechanism.

Wind turbine control tends to be complex, as wind speeds fluctuate in both intensity and direction. Horizontal and vertical wind shears, mechanical oscillations, and yaw misalignment, together with natural wind turbulence and tower motion, also induce dynamic and asymmetric loads on the rotor blades. These loads are transferred to the rotating main turbine shaft where they appear as forces or bending/twisting/torque moments. Specifically, these loads generate large torques, bending moments, twisting moments, stress forces and strain forces. For a wind turbine, the shaft torque may also have dynamic components induced by current flowing on the electrical grid and the turbine control system. These dynamic components are also of interest from a design, control and reliability standpoint.

The forces imposed by these operating conditions, sometimes referred to as loads, also increase the number of fatigue cycles accumulated by the wind turbine. Such loads and fatigue cycles can lead to premature system failure, operational inefficiencies, and damage to the wind turbine components.

To ensure reliable and efficient operation, wind turbine control systems should accurately measure the forces and the bending/twisting/torque moments acting on the shaft and control one or more operational parameters of the wind turbine system, such as the blade pitch, revolutions per second and/or yaw angle, to limit these forces. Accurate measurement of rotational speed of the shaft and shaft position (i.e., an angle a fixed point on the shaft makes with a fixed point external to the shaft) are also required for proper and safe operation of the wind turbine. The accuracy of these measurements must be maintained over a relatively long period. Wind turbine control also becomes more complex as the wind turbine size and energy output increase. In addition to using these measured values to control the wind turbine, the measured values can be used in wind turbine design.

To address the design and operation of any equipment using a rotating shaft, it is desired to measure any external force-induced deformations at the shaft surface. These measurements can be used to numerically determine the bending/twisting/torque and moments and other forces imposed on the shaft.

Conventional shaft control technologies employ a number of different sensors and/or systems to sense or measure these forces and shaft operating parameters. These sensors include, but are not limited to, strain gauge systems, encoder/tooth systems, acoustic wave systems, elastic systems, magnetostrictive systems and magnetoelastic systems. Each of these systems has certain characteristics and applications, as well as specific advantages and disadvantages.

Strain gauges embedded in or attached to the shaft provide local shaft strain measurements. These gauges require an electrical coupling to the rotating shaft, i.e., a physical connection (e.g., slip rings) or a wireless connection, and the signals produced have a relatively low signal-to-noise ratio. The strain gauges also suffer from low stability, limited bandwidth and tend to require frequent calibration. The limited operating temperature range of strain gauges limits their use in harsh environments. Also, strain gauges may fail after a short period of use due to the large stresses imposed on the shaft in applications with large diameter shafts in high power applications. Thus strain gauges are seldom used in commercial power train equipment.

An encoder/tooth-wheel torque sensor requires some mechanical interaction with the rotating shaft, such as by a magnetic tooth-wheel. But the tooth-wheel design tends to be costly and impractical for many applications. Such a design is not practical for higher speed applications, imposes reliability issues in a harsh environment and although stable, lacks high resolution.

An acoustic wave system utilizes sensors, such as surface acoustic wave (SAW) and bulk acoustic wave (BAW) sensors, mounted on the shaft for measuring shaft strain. Slip rings or a wireless system are required to carry the signals indicating shaft deformations and forces imposed on the shaft to an external detector.

Elastic torque systems measure the twisting of the shaft by measuring angular displacement of markers disposed across a length of the shaft. This system may not be sufficiently accurate for large diameter shafts and may have practical implementation problems.

Proximity sensors are also employed to measure shaft bending moments. These sensors require a stiff reference (i.e., a stiff support structure) and are vulnerable to deflection of the support structure and sensor drift, leading to errors in measured values. Since the main shaft system is stiff, small offset errors in the measured, such as 0.1 mm, correspond to high errors in the bending moment analysis, such as an error of 200 kNm. These errors can cause improper operation of the shaft control system.

Shaft position can be determined by angular encoders that employ optical gratings. The shaft is encoded prior to installation and the encoded regions detected to determine shaft position. But these sensors are prone to contamination and failure in dirty environments.

Magnetic shaft force sensors, as described by NCT Engineering GmbH. (Erlenhof-Park. Inselkammerstr. 10, 82008 Unterhaching, Germany) and others, cannot be applied to large shafts in a cost efficient manner, e.g. on shaft diameters greater than about 200 mm, due to the high power required to encode the shaft.

Another approach to measuring forces imposed on the shaft is based on the magnetostrictive effect on ferromagnetic shaft material or on ferromagnetic material regions applied to or formed in the shaft. Magnetostrictive measurements are based on the phenomenon that a material changes dimensions when magnetized. For certain materials the magnetostrictive effect is very small.

A conventional magnetostrictive torque sensor comprises a primary coil that generates a high frequency magnetic field and secondary coils that measure the magnetic flux of the resulting field. The total measured flux from all of the secondary coils indicates whether a torque is present. This approach does not require encoding of the shaft.

Typical magnetostrictive coefficients, in the form $\Delta l/l$, are on the order of $1 \times 10^{-6}$ to $25 \times 10^6$. The use of the direct (i.e., no encoding of the ferromagnetic material) magnetostrictive effect for measuring torque on large shafts of ferromagnetic material is expensive, requires complex sensor arrangements, difficult calibration procedures and typically results in measurements with limited accuracy.

However, the magnetostrictive effect can be advantageously used with improved accuracy and reduced installation costs by combining the magnetostrictive effect with a magnetically encoded shaft or with magnetically encoded regions applied to the shaft. The shaft material or the material regions are encoded by passing current through the shaft or material regions during shaft manufacture or after installation of the shaft. The encoding is permanent when applied to a suitable material and when created by a current with a sufficiently high current density.

Encoding electrodes are electrically coupled to the shaft to support current flow from one or more input electrodes through regions of the shaft to one or more output electrodes. The current induces a magnetic field that creates magnetically polarized encoded regions within the shaft. When the encoding current and the resultant encoding magnetic field are applied to a ferromagnetic material, the boundaries between magnetic domains shift and the domains rotate. Both of these effects change dimensions of the material along the magnetic axis. Preferably the encoding electrodes are disposed to create a plurality of uniform magnetic regions on the shaft.

Conversely, one or more magnetic parameters of the material change when subjected to a mechanical force or a bending/twisting/torque moment. Specifically, these forces change the material properties and in turn cause a change in an external component of the magnetic field. These changes in the magnetic field can be detected by magnetostrictive sensors, such as fluxgate sensors.

A typical magnetostrictive torque sensor employs total shaft encoding, with the magnetization created by axial current flow along the shaft. The encoding is circumferentially uniform (circumferentially uniform) as the magnetic encoding requires magnetization of the entire cross-section. To create these uniform circumferential magnetic regions, multiple electrodes are disposed in ring-like arrays around the shaft and current is simultaneously applied to all electrodes. The magnetization is created (i.e., the shaft is encoded) by directing current to flow in an axial direction along the shaft from input electrodes to output electrodes.

However, large diameter shafts, such as wind turbine shafts (and gas turbine shafts), are typically not amenable to the conventional magnetic encoding technique as described immediately above. These techniques are suitable for relatively small diameter shafts but as the shaft diameter increases, the number of electrodes required to magnetically encode the shaft increases and the required current carried by each electrode also increases. For example, a current of several hundred amperes may be required for each electrode pair (a pair comprising an input and an output electrode). For accurate torque detection (or detection of any forces exerted on the shaft), the encoding must create a circumferentially uniform magnetic field; a difficult and costly effort to implement on large diameter shafts. Disadvantageously, the rotational speed of the shaft cannot be determined from a circumferentially uniform magnetic field.

Non-uniform magnetic fields are caused by non-homogeneity of the electrical and magnetic properties of the shaft. Further, the current is typically supplied as specifically-shaped current pulses, requiring complex electronic circuits to support the high-current. For all of these reasons, circumferentially uniformly encoding schemes applied to large diameter shafts tend to be difficult and very expensive to implement.

Examples of prior art magnetostrictive encoding and sensing is described with reference to FIGS. 1-4. Referring to FIG. 1, a shaft 5 comprises a ferromagnetic material. Spaced-apart ring-like electrodes 10 and 15 are disposed about a shaft circumference to encode an axial region 20 between the electrodes 10 and 15. Both the electrodes 10 and 15 are in electrical contact with the shaft. Spacing the electrodes apart tends to promote a uniform magnetic flux density within the region 20, thereby creating a circumferentially uniform encoded region. Uniformity of the flux density also depends on several other factors, including the shaft diameter. Additional pairs of electrodes (not shown), such as the electrodes 10 and 15, are axially disposed along the shaft to encode additional regions for detecting forces imposed at other shaft segments.

During the encoding process a current pulse 25 is applied to the electrode 15 to establish a current flow 30 along the longitudinal axis of the shaft 5 and within the region 20. After flowing along the region 20, the current is received by the electrode 10 to produce an output current 35. Current flow through the encoded region 20 induces a magnetic field that aligns the magnetic domains. Permanent magnetization of the shaft regions requires a high current density within that region.

All magnetic field sensor techniques that employ permanent magnetization of the shaft, such as described above, detect the externally-measurable magnetic field caused by the permanent magnetization. These field sensors also detect changes in the magnetic field that are caused by bending/twisting/torque and other forces. These forces change the magnetic permeability of the material, thereby altering some aspect of the magnetic field in the material and also altering the external magnetic field. Depending on the geometry of the unaltered field and the nature of the imposed forces, the forces may change the direction of the field or the intensity of the field (i.e., either a change in the field intensity or the flux density) or both.

Generally it is common in the art to refer to an altered magnetic field as one that includes changes in field strength or magnetic flux. A distorted field typically refers to changes only in a direction of the magnetic field.

When the shaft 5 is in operation, sensor coils 45 (only one shown in FIG. 2) mounted proximate the rotating shaft 5 sense the magnetic field and produce a signal representative of that field. With no stress or torque applied, the sensors do not detect any magnetic field distortions or alterations. Such sensors typically exhibit a directionality characteristic, as uniaxial sensors cannot discriminate changes in direction and strength.

The sensor coils 45 comprise fluxgate sensors, or other magnetic field sensors such as coil sensors, inductive sensors, or Hall effect sensors.

When a torque is imposed on the shaft 5 or a region of the shaft 5, the altered magnetic field emerging from the encoded region 20 is detected by the sensor coils 45. The sensor coils 45 are typically coupled to electronic processing components for analyzing and displaying the magnetic field distortions and alterations, and for indicating the imposed forces, especially including torque.

The prior art system as described above and illustrated in FIGS. 1 and 2 employs axial current flow to create uniform circumferentially uniform shaft magnetization. This technique requires magnetization of the entire shaft circumference and is therefore not practical for larger diameter shafts, as these shafts require a large encoding current to produce sufficient flux densities to create permanent and uniform magnetic regions in the shaft. While technically feasible and possible, the requirement for these large currents makes it expensive to achieve a uniform current distribution and density in a circumferential direction for large diameter shafts. Thus this encoding scheme is typically limited to smaller shafts below approximately 200 mm in diameter.

To alleviate concerns associated with large diameter shafts and the attendant requirement for large currents, one known technique uses multiple electrical connections to the shaft 5 as shown in FIG. 3. Spaced-apart rings 50 and 55 are disposed proximate the shaft 5 and insulated from the shaft 5, with each ring 50/55 having multiple electrical conductors 60 that are attached to the shaft 5. An input current 65 supplied to the ring 50 flows through the conductors 60 then axially through the region 80 and emerges through the ring 55. Current flow through the region 80 produces multiple magnetized regions 75 (only one shown in FIG. 3).

The complex encoding arrangement of FIG. 3 requires a small spacing between the rings 50 and 55 relative to the shaft diameter. Otherwise, a sufficiently uniform magnetization in a circumferential direction is not achievable. Larger spacing between the rings 50 and 55 increases the length of the region 80, which causes implementation problems and additional expenses in many applications. In addition, individual currents applied to the electrical conductors 60 must all have the same amplitude, requiring precise control and considerable expense to implement in larger diameter shafts.

Co-owned patent application publication 2009/0301223 (application Ser. No. 12/134,689) describes and claims yet another encoding scheme for use with large diameter shafts. This patent application publication is incorporated herein by reference. FIG. 4 depicts a shaft 205 having magnetically polarized encoded regions or channels formed by an encoding structure 210. A material of the shaft 205 comprises a ferromagnetic material or a ferromagnetic material affixed to the shaft 205. Alternating conducting members 215 and 217 are axially-positioned along a portion of the shaft 205 and supported by a non-conductive frame 212. The members 215 and 217 are disposed proximate the shaft 205 with a gap between each member 215 and 217 and a surface of the shaft 205. The positive encoding conducting members 215 alternate with negative encoding conducting members 217.

A first end of each conducting member 215 is coupled to a positive terminal of an encoding or current source 250 (only one illustrated in FIG. 4) and a second end is coupled to the shaft 205 at an electrode 218 via a conductor 242. A negative terminal of the encoding source 250 is coupled to an electrode 247 disposed on the shaft 205.

A first end of each conducting member 217 is coupled to a negative terminal of an encoding or current source 252 (only one illustrated in FIG. 4) and a second end is coupled to the shaft 205 at an electrode 220 via a conductor 243. A positive terminal of the encoding source 252 is coupled to an electrode 248 disposed on the shaft 205.

Electrical current from each conducting member 215 travels through the shaft 205 in a direction as indicated along a path 245 to generate a positive magnetically polarized channel 260 (only one shown in FIG. 4) on the shaft 205. Similarly, electrical signals from each conducting member 217 travel through the shaft 205 in a direction as indicated along a path 249 to generate a negative magnetically polarized channel 262 (only one shown in FIG. 4) on the shaft 205. The direction of current flow for the paths 245 and 249 are in opposite directions and thus the magnetic domains are oppositely polarized (positive or negative) within the magnetized channels 260 and 262.

When the shaft 205 is in operation, magnetic fields produced by the positive and negative magnetically polarized channels 260 and 262 have an expected shape and are detected by sensors (not shown in FIG. 4). When a torque or another force acts on the shaft 205, the magnetic fields produced by the channels 260 and 262 are altered or distorted. The sensors detect these changes and responsive thereto indicate the presence of a force within the encoded regions (i.e., the region including the channels 260 and 262) of the shaft 205.

The technique described with reference to FIG. 4 may be considered a form of sectional magnetic encoding, as only the regions (sections) or channels 260 and 262 are encoded. Depending on the orientation of the encoded sections on the shaft, this technique may be capable of measuring angle of rotation, rotational speed and forces imposed on the shaft, including bending/twisting/torque forces. But this technique is limited to measuring or detecting these parameters only on individual torque sensitive areas on the shaft, i.e., the encoded regions. When the shaft is sectionally encoded, continuous torque measurement is possible only by mounting a magnetic field sensor on the shaft such that the sensor rotates with the shaft. As the sensor rotates, it continuously measures parameters of interest. But requiring the sensor to rotate with the shaft adds complexity to the system, requiring slip rings or wireless data transmission systems and wireless power supplies or batteries.

Various processes and systems have been used to provide accurate and reliable measuring capabilities for a rotating shaft, some of which have been described above. However continued improvements are needed, especially with respect to larger diameter shafts, and enhancements in operational efficiency are desired. The present invention presents a new and nonobvious technique for sectionally encoding the shaft and a pattern of sectionally encoded regions to measure forces imposed on the shaft, especially large diameter shafts. The pattern of encoded regions may also permit simultaneously determining a rotational angle and a rotational speed of the shaft.

BRIEF DESCRIPTION

A first embodiment of the present invention comprises a magnetically spirally encoded shaft. The shaft comprises a first band comprising first magnetically encoded regions having a first magnetic polarity alternating with second magnetically encoded regions having a second magnetic polarity; a second band comprising the second magnetically encoded regions alternating with the first magnetically encoded regions, wherein the first band is spaced apart from the second band such that first magnetically encoded regions in the first band are opposite second magnetically encoded regions in the second band and second magnetically encoded regions in the first band are opposite first magnetically encoded regions in the second band, magnetic fields present above each force-sensitive region between the first and the second magnetically encoded regions; wherein the first and second bands are disposed in a spiral shape around a shaft circumference; and the shaft for use with a first fixed magnetic field sensor for detecting magnetic fields in the force sensitive region, wherein one or more of rotational speed, shaft rotational position, bending moments and torque can be determined responsive to the detected magnetic fields.

Another embodiment comprises, a magnetically spirally encoded shaft and magnetic field detecting system readout system. This embodiment comprises first, second, third and fourth magnetically encoded bands spirally encircling the shaft, each band comprising first magnetically encoded regions having a first magnetic polarity alternating with second magnetically encoded regions having a second magnetic polarity; first, second, third and fourth dead zones defined in each band between successive first and second magnetically encoded regions; the first and second bands spaced apart by a first distance and the third and fourth bands spaced apart by the first distance, a second distance greater than the first distance between the first and third and bands and between the second and the fourth bands; first magnetically encoded regions opposite second magnetically encoded regions in the first and second bands and defining a first force-sensitive region therebetween; first magnetically encoded regions opposite second magnetically encoded regions in the third and fourth bands and defining a second force-sensitive region therebetween.

In this embodiment of the invention the first force-sensitive regions are spaced opposite first and second dead zones in the third and fourth bands and the second force-sensitive regions are spaced opposite third and fourth dead zones in the first and second bands. Sensors mounted proximate the shaft detect magnetic fields surrounding the first and second force-sensitive regions, wherein a force exerted on one or both of the first and second force-sensitive regions alters the magnetic field surrounding the respective first and second force sensitive regions, the alterations indicative of the force exerted.

DRAWINGS

The present invention can be more easily understood and the advantages and uses thereof more readily apparent when the following detailed description of the present invention is read in conjunction with the figures wherein:

FIGS. 1-4 illustrate prior art magnetostrictive encoding and sensing systems for shaft torque sensing.

Figure 16:
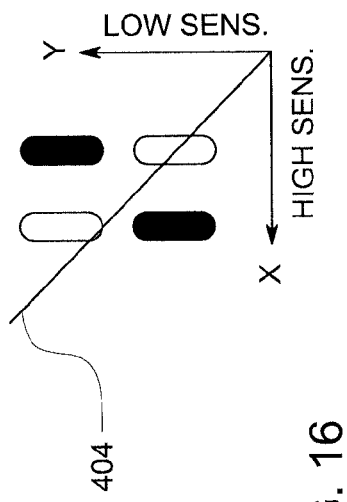

FIG. 16 indicates sensitivities of magnetic tracks on a shaft with respect to the orientation of a force sensitive region.

FIGS. 17 and 18 illustrate shafts with spatially-offset tracks encoded thereon.

Figure 19:
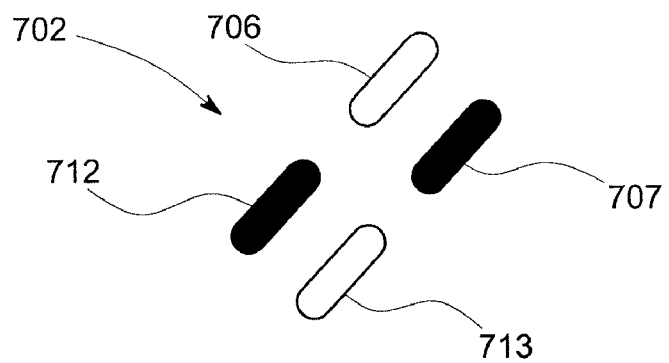
Figure 20:
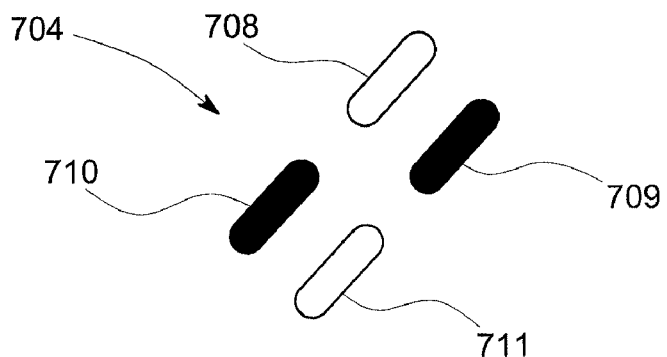

FIGS. 19 and 20 illustrate clusters of several magnetically-encoded tracks.

Figure 21:
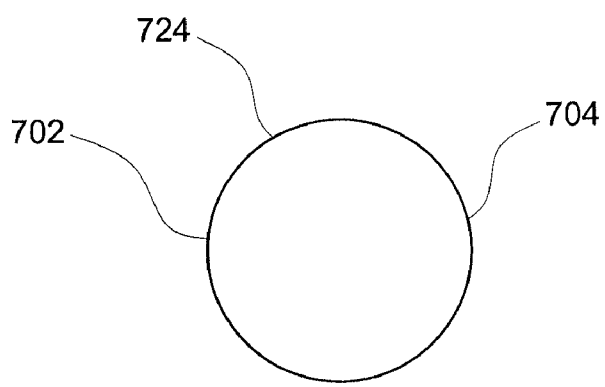

FIG. 21 illustrates a shaft and a location of the magnetically-encoded tracks of FIGS. 19 and 20 relative to the shaft.

FIG. 22 illustrates a shaft and sensors mounted proximate thereto.

In accordance with common practice, the various described features are not drawn to scale, but are drawn to emphasize specific features relevant to the inventions. Like reference characters denote like elements throughout the figures and text.

DETAILED DESCRIPTION

Before describing in detail the particular methods and apparatuses related to sectional magnetic encoding of shafts to measure shaft operating parameters and forces imposed on the shaft, it should be observed that the present invention resides primarily in a novel and non-obvious combination of elements and process steps. So as not to obscure the disclosure with details that will be readily apparent to those skilled in the art, certain conventional elements and steps have been presented with lesser detail, while the drawings and the specification describe in greater detail other elements and steps pertinent to understanding the inventions.

The presented embodiments are not intended to define limits of the structures, elements or methods of the inventions, but only to provide exemplary constructions. The embodiments are permissive rather than mandatory and illustrative rather than exhaustive.

The various embodiments of the invention can detect one or more of torque, bending moments and other forces applied to the shaft. The various embodiments can also determine shaft angular position and shaft speed.

The accuracy of magnetostrictive measurement systems can be improved by using unique magnetically encoded regions created in the shaft or on a magnetically encoded material applied to the shaft. The magnetic encoding essentially turns the shaft into a component of the sensing system and produces a strong magnetic circuit within the shaft and magnetic field components external to the shaft. Detecting alterations or distortions in the external magnetic field indicate the presence of torque or another force on the shaft. Detection of the magnetic field can also be used to determine shaft angular position, shaft rotational speed.

Figure 4:
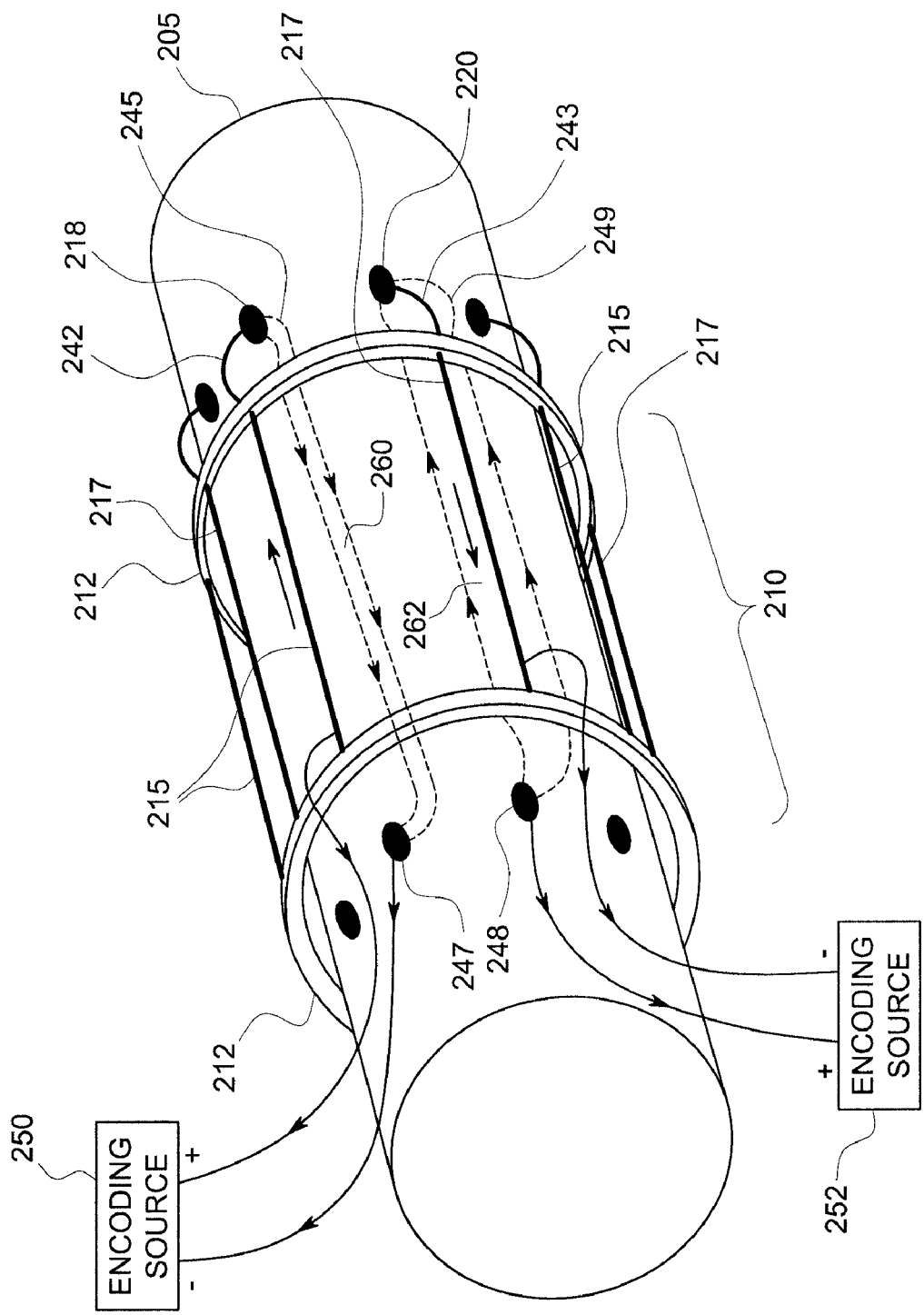
Figure 5:
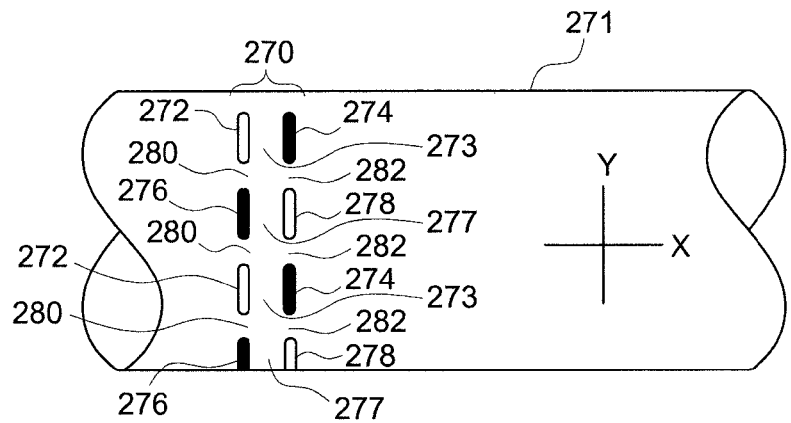
FIG. 5 illustrates a shaft having magnetic tracks encoded thereon for determining torque and other forces imposed on the shaft.

A magnetically encoded region 270 on a shaft 271 is depicted in FIG. 5. The encoded region 270 comprises four magnetically encoded tracks or magnetically encoded regions 272, 274, 276 and 278 disposed around a circumference of the shaft 271 in two bands or rings. A first band or ring of tracks comprises alternating tracks 272 and 276, and a second band or ring of tracks comprises alternating tracks 274 and 278. The tracks 272 and 276 are formed with a gap or dead zone 280 between alternating tracks 272 and 276. The tracks 274 and 278 are formed with a gap or dead zone 282 between alternating tracks 274 and 278. A gap 273 is disposed between the axially-aligned tracks 272 and 274 and a gap 277 is disposed between the axially-aligned tracks 276 and 278. The gaps 273 and 277 define regions that are torque-sensitive (and sensitive to other forces having one or more force vector components that pass through these regions) as described below.

A typical material of the shaft 271 comprises a standard steel alloy, such as 34CrNiMo8. Other materials suitable for use include: 1.2721 50NiCr13, 1.4313X 4CrNi13-4, 1.4542X 5CrNiCuNb16-4 and 30CrNiMo8.

Figure 6:
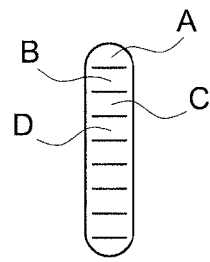
FIG. 6 illustrates magnetic zones of one of the magnetic tracks of FIG. 5.

Each of the tracks 272, 274, 276 and 278 comprises a plurality of magnetically encoded zones A, B, C, D, etc. as illustrated in the exemplary track of FIG. 6.

Figure 7:
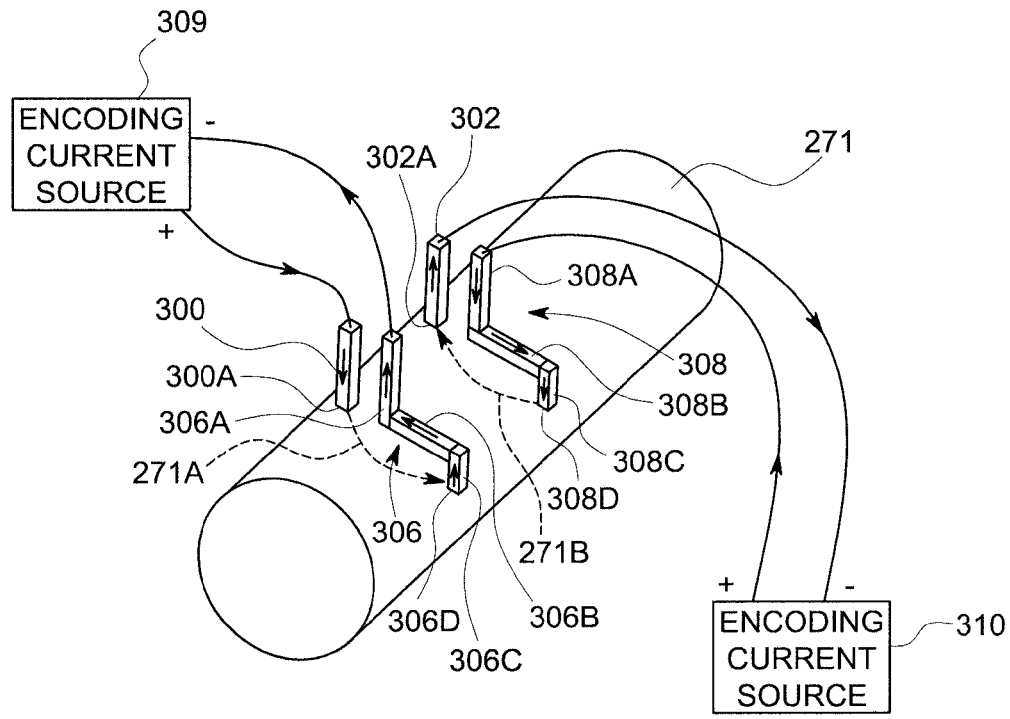
FIG. 7 illustrates an apparatus for forming the magnetic zones of FIG. 6.

The four tracks or encoded regions 272, 274, 276 and 278 and their constituent magnetically encoded zones are formed by an electrode array comprising four spaced-apart electrodes 300, 302, 306 and 308 as illustrated in FIG. 7. The electrodes 300 and 302 are axially aligned and the electrodes 306 and 308 are axially aligned; the electrodes 300 and 302 (which form the encoded regions 272 and 276) are circumferentially displaced from the electrodes 306 and 308 (which form the encoded regions 274 and 278). All the electrodes 300, 302, 304 and 306 are separated by a fixed distance and move as a unit. This electrode array or another appropriately spaced and oriented electrode array can be used to encode magnetically polarized zones/tracks of any desired shape according to the teachings of the present invention.

The electrodes 300 and 302 are in physical contact with the shaft 271 at respective contact points 300A and 302A. The electrodes 306 and 308 each comprise three segments: upright segments 306A/308A, tangential segments 306B/308B and upright segments 306C/306C. The upright segments 306A/308A are not in contact with the shaft 271; the tangential segments 306B and 308B are not in contract with the shaft 271; only a contact point 306D/308D at a terminal end of the uprights segments 306C/308C is in contact with or at least closely proximate to the shaft 271.

To form the tracks 272 and 276, i.e., to encode the shaft 271, current pulses are supplied from a positive terminal of an encoding source 309 to the electrode 300, current exits the electrode 300, at the contact point 300A, flows through a region 271A of the shaft 271, enters and flows through the upright segment 306C, flows through the tangential segment 306B, through the upright segment 306A and to a negative terminal of the encoding source 309. This current flow forms one of the magnetically polarized or encoded zones A, B, C, D, etc. in each of the tracks 272 and 276, as illustrated in FIG. 5. A zone is formed by current that aligns the magnetic domains of the shaft material, i.e., magnetizing the material of the shaft.

The magnetically polarized zones comprising the tracks 274 and 278 are formed concurrently with formation of the zones that comprises the tracks 272 and 276. The magnetically polarized zones of the tracks 274 and 278 are formed by current pulses flowing from a positive terminal of an encoding current source 310 to the upright segment 308A, through the tangential segment 308B, through the upright segment 308C, through a shaft region 271B to the contact point 302B, up through the electrode 302 and to a negative terminal of the encoding source 310. The pulses are supplied from the encoding source 309 at the same time as the pulses are applied from the encoding source 310.

After each zone (for example, zone A) is formed the electrodes 300, 302, 306, and 308, which are mechanically supported by an array support structure and move as a unit, are stepped circumferentially as a unit to another location and current pulses applied again. This process creates another magnetically encoded zone, e.g., the zone B for each of the magnetic tracks 272, 274, 276 and 278. Thus application of a series of current pulse and circumferentially stepping the electrodes after each current pulse creates the individual zones A, B, C, D, etc. The zones are spaced apart about 0.5 mm. Since the magnetic zones are slightly larger than the step size the magnetic zones fuse or merge to form the magnetic the tracks or encoded regions 272, 274, 276 and 278. The tracks 272, 274, 276 and 278 are also referred to as sectional tracks or sectional encoded regions as each encompasses a section of the shaft 271.

A direction of current flowing through the shaft 271 (i.e., into the shaft from one electrode and out from the shaft at the other electrode) determines the magnetic polarization (i.e., direction of the magnetic field lines) of the encoded zones, the tracks formed from those zones and the magnetic polarization of the surrounding areas of the shaft.

The location of maximum tangential (or axial) positive magnetic field strength is designated by an open or clear oval in FIG. 5. The location of maximum tangential (or axial) negative magnetic field strength is depicted by a blackened oval. In the various presented embodiments, the regions of maximum positive magnetic field strength may be exchanged with the regions of maximum negative field strength without departing from the scope of the present invention. The terms positive and negative magnetic field strength reflect the direction of the magnetic field lines, e.g. positive magnetic field strength refers to field lines pointing to the right along the shaft 271 and negative magnetic field strength refers to field lines pointing to the left along the shaft 271. However, this definition is not required for proper operation of the invention.

The track 272 and its individual zones A, B, C, D, etc. are formed where the current pulses enter the shaft 271 and the track 276 and its constituent zones A, B, C, D, etc. are formed where the current pulses exit the shaft 271. Similarly, the encoded region 274 and its individual zones A, B, C, D, etc. are formed where the current pulses exit the shaft 271 and the track 278 and its constituent zones A, B, C, D, etc. are formed where the current pulses enter the shaft 271.

In one embodiment, the array of electrodes 300, 302, 304 and 308 are moved about 30 mm in between about 20 to 50 steps, forming a like number of encoded zones A, B, C, D, etc. Also, a circumference of the shaft determines whether the segments 306B and 308B are linear or a curved. For larger diameter (and therefore larger circumference) shafts, e.g., a diameter of about 730 mm, a linear segment 306B and 308B of about 30 mm in length is satisfactory. But a shaft having a diameter of about 60 mm requires using tangentially curved segments 306B and 308B.

Figure 8:
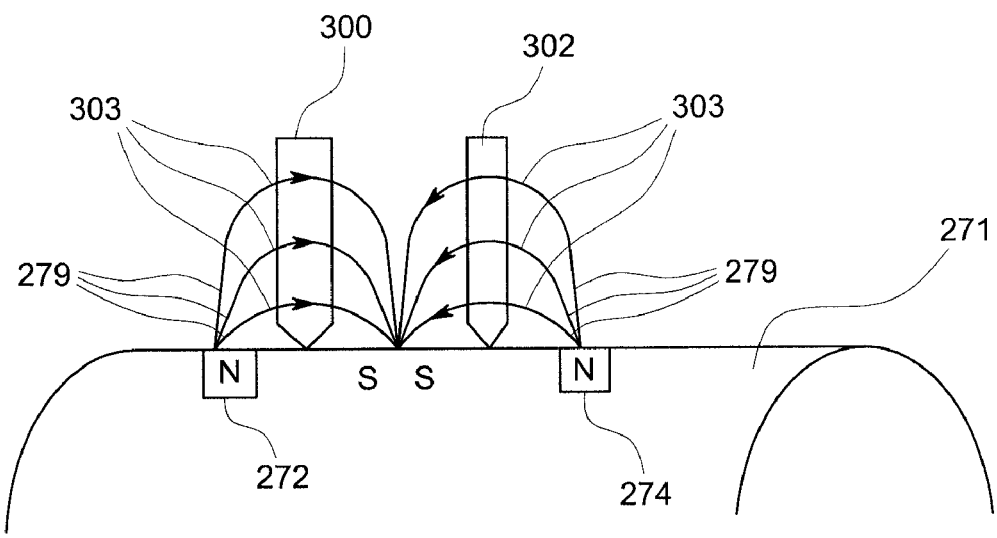
FIG. 8 illustrates field lines of a magnetic field proximate an encoded shaft.

FIG. 8 is an axial cross-sectional view through the shaft 271, a portion of the magnetically polarized tracks 272 and 274 formed therein and the two axially-aligned electrodes 300 and 302. Thus the view illustrated in FIG. 8 is defined by a plane passing through the tracks 272 and 274 and the axis of the shaft 271. The tracks 272 and 274 and the magnetic field lines 279 surrounding each of the tracks are depicted. A reference to the magnetic poles (north (N) and south (S)) is also included. Magnetic fields with the same characteristics repeat at each magnetically polarized track or region, i.e., tracks or regions having an orientation with a positive magnetically polarized region on the left and a negatively polarized region on the right. As is known to those skilled in the art, magnetic fields are three dimensional with only two dimensions illustrated in FIG. 8.

The tracks 276 and 278 appear in another view (not illustrated) circumferentially displaced from the plane of FIG. 8. However, for the track 276 (on the left) and the track 278 (on the right) the field directional arrowheads are reversed from the FIG. 8 depiction.

Magnetic field sensors (or a magnetic field scanner or an array of sensors or scanners) used with the present invention are "blind" for all magnetic field components except the components in the axial direction. Thus the field sensors are most sensitive to the axial or tangential field components identified by a reference character 303 in FIG. 8. Non-limiting examples of sensors used with the present invention can include, Hall effect sensors, magnetic field sensors, sensor coils with an air core, fluxgate sensors, anisotropic magnetostrictive sensors, an giant magneto-resistive (GMR) sensors. Additional non-limiting examples of magnetic field sensors include; fluxgate magnetometers, search coils, fiber-optic magnetometers, optically-pumped magnetometers, SQUIDS, and nuclear precession magnetometers.

Processing of the measured magnetic field is typically executed by a processor (not shown). The processor is further configured to compute various shaft parameters, based on the sensed magnetic field, such as angular velocity, angular acceleration, angular position, torque, bending moments, twisting moments and other forces exerted on the shaft. Embodiments of the invention are not limited to any particular processor for performing the processing tasks associated with the present invention. The term "processor" as that term is used herein, is intended to denote any machine capable of performing the calculations or computations necessary to perform the tasks associated with the invention. The term is also intended to denote any machine that is capable of accepting a structured input and processing that input according to prescribed rules to produce an output. It should be noted that the phrase "configured to" as used herein means that the processor is equipped with a combination of hardware and software elements for performing the tasks of the invention as understood by those skilled in the art.

Figure 9:
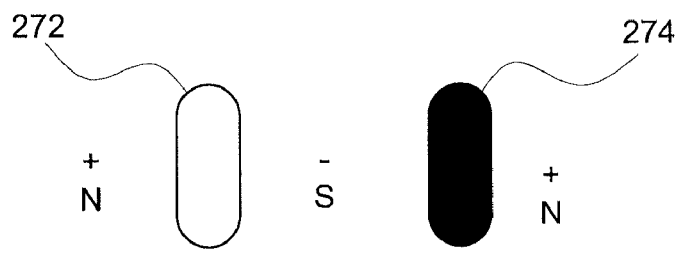
FIG. 9 illustrates two magnetic tracks and a waveform indicating the magnetic fields associated with the magnetic tracks.
Figure 9:
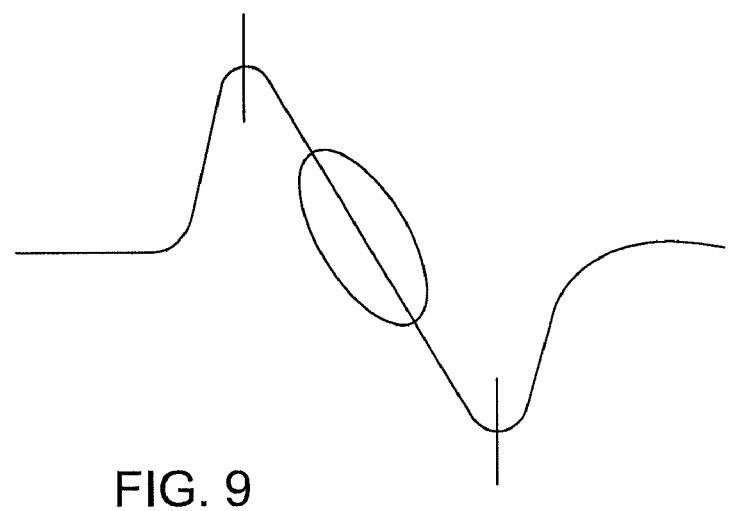

FIG. 9 illustrates two magnetically polarized encoded tracks or regions 272 and 274, for example, and a waveform representing the magnetic field flux density, as illustrated in the lower portion of FIG. 9, associated with each of the tracks 272 and 274. As can be seen, the flux density is at the zero level approaching the track 272 from the left, and increases until reaching a positive maximum in the middle of the track 272. The flux density declines exiting the track 272, until reaching a negative maximum in the middle of the track 274. The flux density increases upon exiting the track 274 to the right and returns to the zero level as the flux density declines with increasing distance from the track 274. A positive sign to the left of the track 272 and to the right of track 274 indicate that the flux density is increasing in those regions. The negative sign between the two tracks 272 and 274 indicates that the flux density is decreasing in that region. Thus the tracks 272 and 274 (and the tracks 276 and 278 not illustrated) indicate regions of maximum magnetic field flux densities, in particular in the axial direction relative to the shaft 271.

In FIG. 9 (and other Figures in the present application) the location of maximum tangential (or axial) positive magnetic field strength is designated by an open or clear oval. The location of maximum tangential (or axial) negative magnetic field strength is depicted by a blackened oval. In the various presented embodiments, the regions of maximum positive magnetic field strength may be exchanged with the regions of maximum negative field strength without departing from the scope of the present invention. As illustrated with reference to FIG. 7, the terms positive and negative reflect the direction of the magnetic field lines, that is, a positive magnetic field strength refers to field lines pointing to the right and a negative magnetic field strength refers to field lines pointing to the left.

Returning to the electrode array of FIG. 7, the encoding current source 309 can typically generate unipolar pulses (either positive-going or negative-going) from a few hundred amperes to a few kiloamperes, with a pulse length of about 0.1-100 msec. In a typical exemplary application the pulse duration is about 1 msec, with a current of about 500 A, and a shaft diameter of about 730 mm. The depth of current penetration and current density in the shaft 271 is controlled by the duration of the current pulses.

The encoding sources 309 and 310 may comprise a capacitor bank (i.e., discharging a capacitor through a resistor), a pulse generator or a power electronics device that generates the unipolar current pulse waveforms. Because the current pulses are short, they are characterized by their high frequency content.

In one embodiment the axial distance between the tracks 272 and 274 and between the tracks 276 and 278 is a few millimeters to about one cm. The regions 273 and 277 between the respective tracks 272/274 and 276/278 are sensitive to torque imposed in that region.

The distance between the electrodes 300 and 306, which is the same as the distance between the electrodes 302 and 308, determines a number of magnetically polarized zones that can be formed before the zones created by the electrodes 300 and 302 are overwritten by the zones created by the electrodes 306 and 308. To avoid this overwriting, after encoding a plurality of magnetic zones for each of the tracks 272 and 274 that span a distance approximately equal to the distance between the electrodes 300 and 306 (or the distance between the electrodes 302 and 308), the electrode array must be circumferentially moved by the distance spanned. This movement prevents overwriting of the previously-written tracks 276 and 278 when writing continues to form additional tracks 272 and 274.

For example, in one embodiment, the electrodes 300 and 306 (and the electrodes 302 and 308) are spaced apart a distance equal to about one-half of the shaft circumference. This shaft may then be encoded during a half rotation of the shaft, i.e., rotation through 180 degrees.

By cooperative activation of the stepper motor to circumferentially (or axially) move the electrode array support structure, rotation of the shaft 271, and/or multi-axial actuation of the electrode array support structure, arbitrary magnetization patterns within the limits of electrode geometry can be created in the shaft 271.

Figure 10:
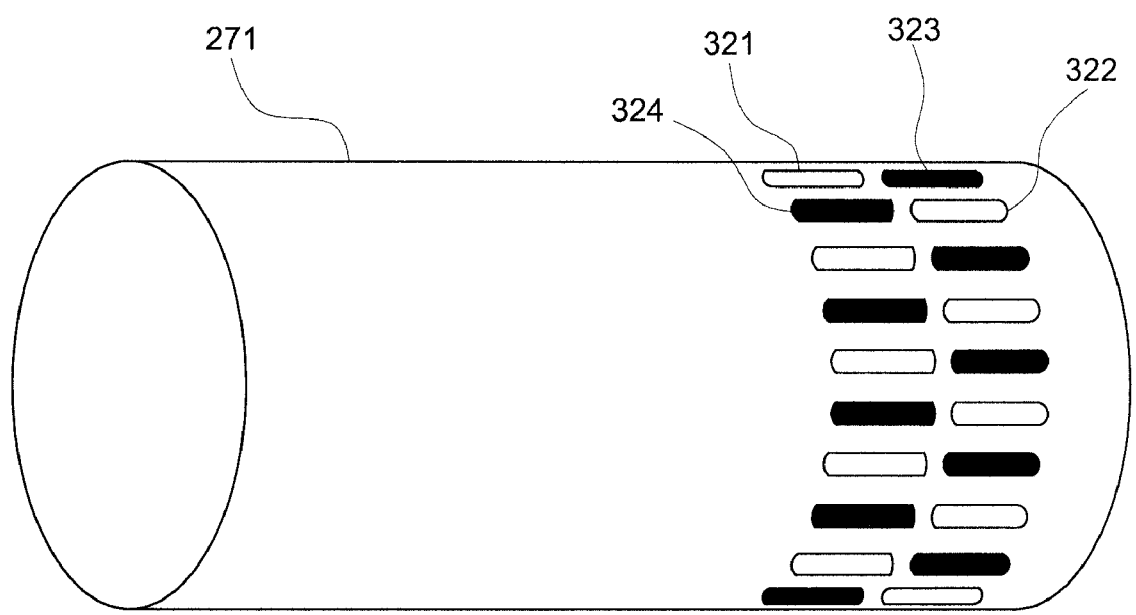
FIG. 10 illustrates a plurality of axial magnetic tracks encoded on a shaft.

For example, if the stepper motor steps the electrode pairs 300/302 and 306/308 in an axial direction along the shaft 271 with no rotation of the shaft about its axis, axial magnetized tracks are formed in the shaft 271 as shown in FIG. 10. The axial tracks 321 and 324 are formed by the respective electrodes 300 and 302 as the electrodes are stepped axially along the shaft 271. Concurrent with forming the tracks 321 and 324, the tracks 322 and 323 are formed by the respective electrodes 306 and 308. After the four axial tracks 321, 322, 323 and 324 are formed, the shaft 271 is rotated and four more axial tracks are formed in the shaft by again stepping the electrodes 300, 302, 306 and 308 axially across the shaft. If the shaft is rotated through 360 degrees, the shaft is encoded throughout its entire circumference.

If the electrode pairs 300/302 and 306/308 are stepped circumferentially to create the four tracks (that is, to create the zones that form the four tracks), after which the shaft is rotated or the electrode array is moved circumferentially, four additional tracks can be formed. The process can continue to form tracks completely around the circumference of the shaft 271. See FIG. 5.

In yet another embodiment, the stepper motor can move the electrode array support structure along any of its multi-axes while the shaft 271 is held stationary or the stepper motor can be moved and the shaft 271 rotated to create any desired magnetically polarized or encoded patterns of tracks.

Figure 11:
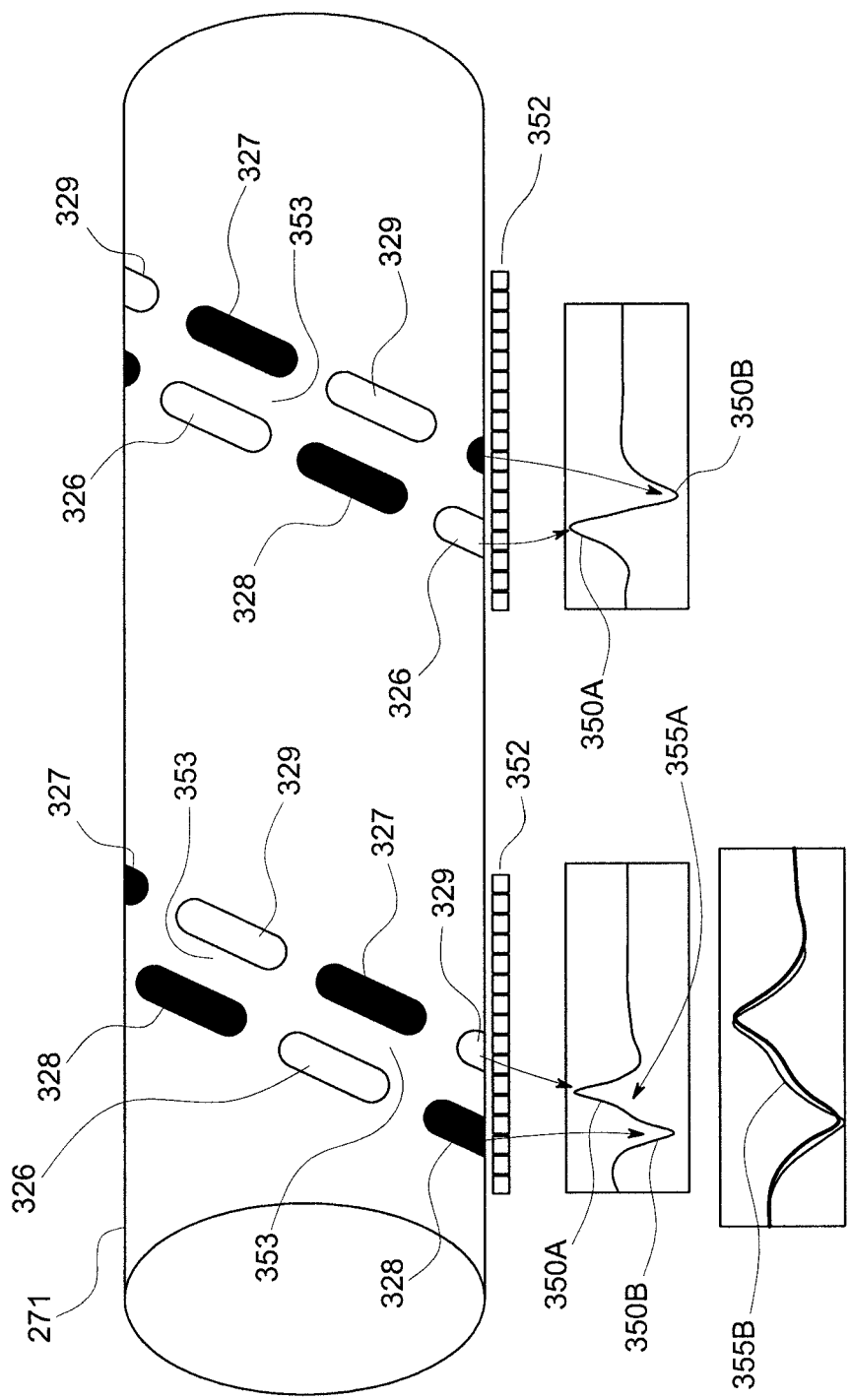
FIG. 11 illustrates a plurality of magnetic tracks encoded on a shaft and waveforms associated with magnetic fields of the magnetic tracks.
Figure 12:
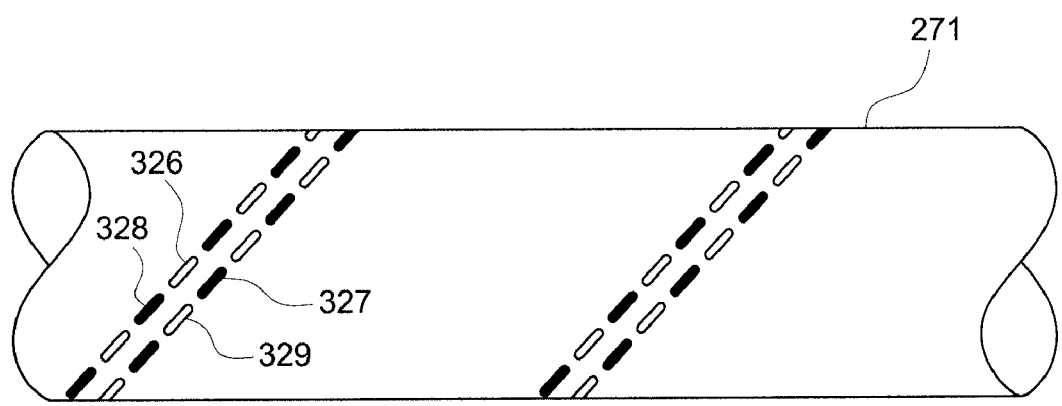
FIG. 12 illustrates spirally magnetically encoded bands.

If the stepper motor is activated and the shaft rotated after each magnetic track is formed, the tracks form an angle relative to the axis of rotation of the shaft 271. Thus the tracks form a spiral pattern, as illustrated in FIGS. 11 and 12, comprising tracks 326, 327, 328 and 329. These tracks can be formed by appropriate motion of the four-electrode array illustrated in FIG. 7 in conjunction with rotation of the shaft 271.

The waveforms below the shaft 271 in FIG. 11 illustrate the various operational parameters that can be determined from the encoded track pattern of FIG. 11. The position of the magnetic field positive and negative peaks 350A and 350B, respectively, as determined by an array of fixed (i.e., they do not rotate with the shaft 271) magnetic field sensors 352, indicate the angular shaft position. The speed at which the peaks 350A and 350B move indicates the rotational speed of the shaft 271. The magnetic field detected between the field peaks 350A and 350B (i.e., within the regions 353 on the shaft 271) is proportional to the torque exerted within that shaft region. A waveform 355A indicates that no torque is present in the region 353; a waveform 355B indicates the presence of a torque by the divergence between the no-torque waveform 355A and the torque waveform 355B. When a mechanical torque is applied to the shaft region 353, the magnetic permeability of that region changes, the magnetic field (flux) is altered and the altered magnetic field detected by the magnetic field sensor 352.

Figure 13:
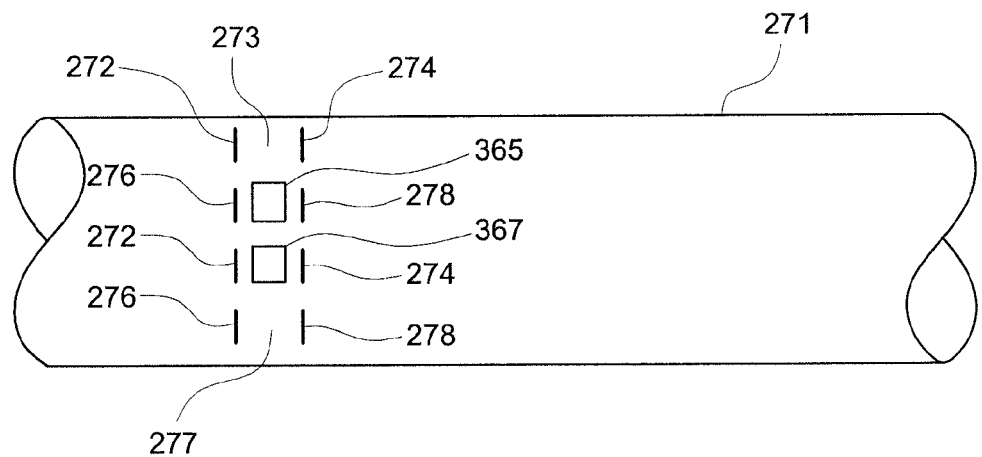
FIG. 13 illustrates a plurality of magnetic tracks on a shaft and a sensor for measuring the magnetic field of the magnetic tracks.

FIG. 13 indicates placement of a magnetic field sensor 365 relative to the circumferential magnetically polarized tracks 272, 274, 276 and 278 of the shaft 271. The sensor 365 is disposed in a spaced-apart relation from the shaft 271 and sensitive to axial components of the magnetic field in the region 277. These axial components are identified by the reference character 303 in FIG. 8. A sensor 367 is disposed between the tracks 272 and 274 (within the region 273) and sensitive to axial field components within the region 273.

A force in a first axial direction with the force vector extending from the magnetically polarized track 274 to the track 272 increases the magnetic field within the gap region 273. A force in a second axial direction opposite to the first axial direction has the opposite effect, decreasing the field strength within the gap region 273.

As in the embodiment illustrated above in conjunction with FIG. 11, the altered field strengths sensed by the magnetic field sensor 365 are compared with an unaltered field (a map of the unaltered field having been acquired prior to imposition of the torque) to reveal torque or force-induced changes in the magnetic field.

An approximate numerical measure of the torque can be determined by first calibrating the magnetic field sensor 365 to determine a relationship between various altered magnetic fields and various known imposed torques. When a torque is detected during operation, a value for the torque is determined according to a monotonic relationship (a transfer function) between the detected change in the magnetic field and the torque.

In one embodiment signals from the sensors 365 and 367 are subtracted to eliminate any common mode effects, such as external magnetic fields. Since stress-related signals from the sensors 365 and 367 have opposite signs, these signals survive the subtraction operation.

Figure 14:
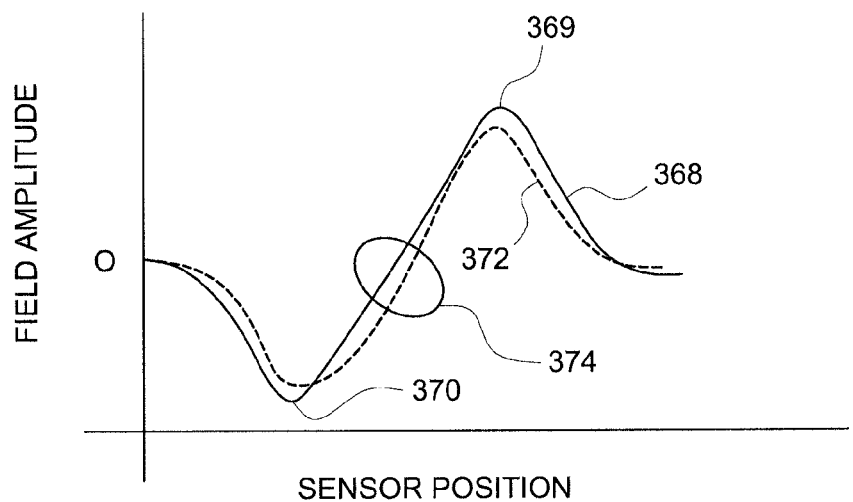
FIG. 14 illustrates a waveform indicating the magnetic field amplitude from magnetic tracks as sensed by the sensor of FIG. 13.

FIG. 14 depicts a waveform or signal trace representing a component of an externally measured magnetic field, such as a magnetic field component of the track patterns of FIG. 5 or FIG. 11. The signal trace may be recorded by moving the magnetic field sensor 365 of FIG. 13 in an axial direction through the regions 272/273/274 of FIG. 5 (or alternatively through the regions 276/277/278 of FIG. 5). Alternatively, the signal trace may be recorded by using an array of individual sensors, such as the sensor array 352 of FIG. 11. The FIG. 14 trace includes a curve 368 (solid line) that represents an amplitude of the magnetic field through the sensed regions as the sensor is scanned axially across the shaft 271 with no torque present during the scan. A positive peak 369 represents a region on the shaft 271 having the highest magnetic field strength in a first axial direction and a negative peak 370 represents a region on the shaft 271 having a highest magnetic field strength in a second axial direction, the first axial direction opposite to the first axial direction.

A curve 372 (dashed line) represents the field across the regions 272/273/274. The curve 372 has a perceptible difference from the curve 368 in a torque-sensitive region of the shaft, such as the regions 273 and 277 in FIG. 5. This torque-sensitive region is indicated by a circle and a reference character 374 in FIG. 14. The difference between the two waveforms represents the altered magnetic field caused by the presence of an axial (i.e., horizontal in the shaft orientation of FIG. 5) force component, such as the axial force component of a torque, in the shaft region 273. A axial torque force component pointing in a first direction causes the curve 372 (indicating the presence of a torque force) to fall to the left of the curve 368 in the region of interest 374; a torque force component in a second direction opposite to the first direction causes the curve 354 to fall to the right of the curve 346 in the region of interest 358.

If the orientation of the encoding regions is altered from the circumferentially-oriented regions illustrated in FIG. 5 to axially-oriented regions, such as a magnetically encoded region 400 in FIG. 16, the force sensing directionality within the encoded region is changed accordingly. In this latter configuration, if the sensor has not been reoriented from its orientation in FIG. 13 (i.e., with the FIG. 13 orientation for detecting axial force components) the sensor detects alterations in the magnetic field that have a component in the axial direction in the region 400C between the tracks 400A and 400B. Since the tracks 400A and 400B are axially oriented, the presence of an axial force component may not be associated with a torque imposed on the shaft.

FIG. 16 illustrates an exemplary force imposed in a direction of an arrowhead 404. Any force imposed in any direction on the XY coordinate system of FIG. 16 can be resolved into an X-directed force and a Y-directed force. As indicated by the coordinate system depicted in FIG. 16, when the magnetically polarized regions are oriented as shown, the sensor exhibits a low sensitivity to force components along the Y-axis and a high sensitivity to force components along the X-axis.

Returning to FIG. 15, it illustrates several different orientations of magnetically-encoded tracks formed in or applied to a shaft 410. The region 400 comprises alternating positive and negative magnetically polarized tracks 400A, 400B, 400C and 400D positioned as shown. A torque sensitive region 403 is disposed between the tracks 400A and 400B and a torque sensitive region 405 is disposed between the tracks 400C and 400D. As shown the tracks 400A and 400C are axially aligned and the tracks 400B and 400D are axially aligned on the shaft 410.

Figure 15:
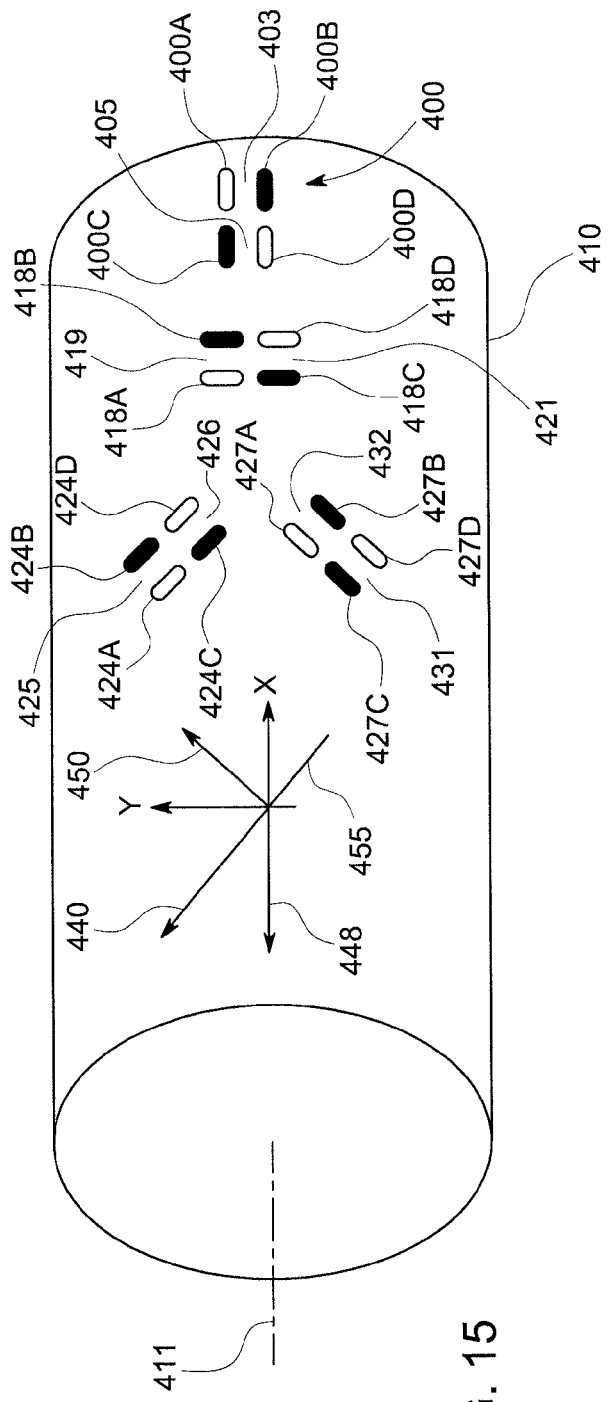
FIG. 15 illustrates a shaft with a plurality of differently oriented magnetic tracks encoded thereon.

FIG. 15 also illustrates exemplary tracks 418A, 418B, 418C and 418D comprising alternating positive and negative magnetically polarized regions; the tracks 418A and 418C are circumferentially aligned, as are the tracks 418E and 418D. Regions 419 and 421 are highly sensitive to axial force components in accordance with the force directionality sensitivity map of FIG. 16.

Tracks 424A, 424B, 424C and 424D form an angle of 135 degrees with the positive x-axis of a depicted coordinate system. Force sensitive areas 425 and 426 are located as indicated.

Tracks 427A, 427B, 427C and 427D are set at an angle of 225 degrees from the x-axis, with force sensitive area 431 and 432 as indicated.

Other tracks at other orientations can also be formed on the shaft 410 by appropriate manipulation of the electrode pairs 300/302 and 306/308 of FIG. 7 and rotation of the shaft 410.

Arrowheads 440 and 448 in FIG. 15 indicate exemplary force directions induced by one or more torque moments (or other forces) applied to the shaft 410. Tensile, compressive, torque and bending loads applied to the shaft 410 are detected by corresponding signals from the magnetic field sensor (or sensor array) that indicate the sensed magnetic field as correspondingly modified by these forces. Thus the various illustrated orientations of the encoded tracks allow detection of forces imposed on the shaft 410 from many different directions.

Generally, two circumferential bands (e.g., a first band comprising the tracks 418A and 418C and a second band comprising the tracks 418B and 418D) and two axial bands (e.g., a third band comprising the tracks 400A and 400C and a fourth band comprising the tracks 400B and 400D) are required to detect all forces exerted on the shaft 410 in any direction if the first and second bands are perpendicular to the third and fourth bands.

Three sets of four bands, the sets spaced at 120 degree intervals around the shaft circumference, can resolve both bending and torque moments.

The tracks 400A, 400B, 400C and 400D are parallel to a rotation axis 411 of the shaft 410. These tracks can detect torque applied to the shaft 410 if a torque vector component passes through the regions 403 or 405 in any direction that is not parallel to the magnetically polarized regions (and is therefore not parallel to the axis of rotation 411). These vector components alter the magnetic field generated by the magnetic domains in the regions 403 and 405 and thus alter the measurable external field above the shaft 410. Further, any torque component that passes through a middle of the regions 403 and 405 (where "middle" is defined as halfway between parallel magnetically polarized regions) produces the largest alteration of the magnetic field.

Bending moments cannot be detected with the orientation of the tracks 400A, 400B, 400C and 400D since a force exerted by bending moments is parallel to the direction of these magnetically polarized tracks. Referring to FIG. 16, such bending moments have a force component parallel to the y-axis (and therefore parallel to the direction of the magnetically polarized tracks) where the magnetically polarized tracks have the lowest sensitivity to forces.

The tracks 418A, 418B, 418C and 418D are normal to the axis of rotation 410 and reference to FIG. 16 indicates that this is an optimum orientation for detecting bending moments with an X-axis component.

The tracks 424A, 424B, 424C and 424D and the tracks 427A, 427B, 427C and 427D are optimally oriented for detecting both torque and bending forces. A unidirectional torque along an axis 450 alters magnetic domains in the regions 425 and 426, which have a high sensitivity to forces along the axis 450. This torque does not alter or alters only slightly domains in the regions 431 and 432 as domains in this region have a low sensitivity to forces along the axis 450.

A unidirectional torque along an axis 455 alters the magnetic field in the region 431 and 432 and therefore generates a corresponding signal in the magnetic field sensor. The torque along the axis 455 does not alter the magnetic field produced by the magnetic domains in the region 425 and 426. Generally, any forces along a first axis (either the axis 450 or 455) alter the magnetic field along the first axis with no (or only slight) alteration in the magnetic field along a second axis perpendicular to the first axis.

Another encoded track or band pattern is illustrated in FIG. 17. A stepper motor and an electrode array having four electrodes arranged as illustrated in FIG. 7, form tracks 500, 502, 504, and 506 in a shaft 508. A region 509 between the tracks is sensitive to forces imposed on the shaft 508 having force components that pass through the region 509. FIG. 16 indicates the directional force sensitivities of the region 509. Gaps 510 and 511 are present between the respective tracks 500/504 and tracks 502/506. The force sensitive region 509 also has a discontinuity or a gap that is aligned with the gaps 510 and 511. That is, gaps 512 are present between the force sensitive regions 509. When one of the gaps 512 faces a magnetic field sensor, the sensor cannot sense the magnetic field and therefore cannot detect forces exerted on the shaft that have a force component within the gap 512.

To overcome this disadvantage and provide continuous detection of torques and other forces, additional magnetically polarized regions 500A, 502A, 504A and 506A are formed axially displaced from the regions 500, 502, 504, and 506 and shifted circumferentially by about half a track length as illustrated in FIG. 17. Thus when a gap 512 is present in the sensing range of the magnetic sensor, one of the force sensitive regions 509A is read by the magnetic field sensor to overcome the inability to sense magnetic fields within the gaps 512. Similarly, when a gap 512A is present in the sensing range of the magnetic sensor, the force-sensitive region 509 is read by the magnetic sensor to overcome the inability to sense magnetic fields within the gap 512A.

The combined magnetic field signals from the offset regions 509 and 509A provide continuous monitoring of the torque or other forces exerted on the shaft 508.

FIG. 18 illustrates an embodiment where the track lengths are nearly 180 degrees long i.e., spanning one-half of the circumference of a shaft 600. A positive magnetically polarized region 604 and a parallel negative magnetically polarized region 608 are formed or embedded in the shaft 600. The tracks 604 and 608 are circumferentially followed by respective gaps 612 and 614 that are circumferentially followed by positive and negative magnetically polarized regions 624 and 620. The regions 604/608 and the regions 620/624 span about 180 degrees around the shaft 600.

Additional magnetically polarized regions are formed axially displaced from the tracks 604, 608, 620 and 624. These tracks comprise positive magnetically polarized tracks 634 and 638, and negative magnetically polarized regions 642 and 650. Gaps 650 and 652 between the respective tracks 630/638 and between the tacks 634/642 are offset from the gaps 612 and 614. This offset value, which is about 90 degrees in one embodiment, provides for continuous (i.e., around the entire circumference) monitoring of any vector force components exerted on the shaft 600 (except for components that are parallel to the tracks 604, 608, 620, 624, 630, 638, 634 and 652 (i.e., circumferential components). Generally, for large diameter shafts the angular span of the tracks will be less than 180 degrees, but this requires encoding additional tracks on the shaft to form a closed ring that completely circumferentially encircles the shaft.

It is noted that additional gaps in the tracks 604/620, 608/624, 630/638 and 634/642 are hidden from view in FIG. 18.

The use of four tracks to span 360 degrees (a first positive and negative magnetically polarized track spanning 180 degrees and a second positive and negative magnetically polarized track spanning 180 degrees) as illustrated in FIG. 18 is merely exemplary. The tracks can be formed of any arbitrary length to span any angular segment as desired. Gaps in the tracks, which delineate a transition from one polarity to another polarity, are offset to ensure that any force imposed on the shaft can be determined at any circumferential region of the shaft.

To create the tracks of FIG. 18 requires two track forming electrode assemblies, with one such assembly illustrated in FIG. 7. The two assemblies (comprising eight electrodes) are axially spaced apart and simultaneously activated to simultaneously create the four tracks, as described herein for a four electrode assembly that simultaneously creates two tracks.

Generally, when in operation, a magnetic sensor senses the magnetic field from the tracks encoded in the shaft. In one embodiment, the sensor is stationary relative to the rotating shaft and is fixedly mounted to a structure proximate the shaft.

With only one sensor mounted on one side of the shaft, torque forces imposed in any of the torque sensitive regions of the various presented embodiments cannot be discriminated from bending moments that also impose a similar force (in direction) in that same region. Also, when employing only one sensor, the force sensing system cannot discriminate imposed forces from changes in an environmental magnetic field.

FIG. 19 illustrates a track cluster 702, comprising opposite polarity tracks 706 and 707 aligned with respective tracks 712 and 713. A force sensitive region is located between the tracks 706 and 707 and another force sensitive region is located between the tracks 712 and 713. Two sensors, not illustrated, sense the magnetic field in each of these regions. FIG. 20 illustrates a track cluster 704, comprising similar tracks 708, 709, 710 and 711 arranged as shown. A force sensitive region is located between the tracks 708 and 709 and another force sensitive region is located between the tracks 710 and 711. Two sensors, not illustrated, sense the magnetic field in each of these force-sensitive regions.

In one embodiment, the track arrays 702 and 704 are disposed on opposite sides of a shaft 724 as generally illustrated in FIG. 21. In operation, signals representing the magnetic field (i.e., the tangential magnetic field) between tracks 706 and 707, between tracks 713 and 713, between tracks 708 and 709 and between tracks 710 and 711 are generated by magnetic field sensors. Then the signals are subtracted as follows: subtract the signal 706/707 from the signal 712/713 to generate a first resultant signal, and subtract the signal 708/709 from the signal 710/711 to generate a second resultant signal. The sum of the first and second resultant signals represents the torque imposed on the shaft 724. The difference between the first and second resultant signals represents bending moments exerted on the shaft 724.

It should be noted that the signals generated by the magnetic field between the tracks 706 and 707 is always complementary to the signals generated by the magnetic field between the tracks 712 and 713, given that a stress force vector passes through both force sensitive regions in the same direction.

In another embodiment, the tracks 706/707 are located on opposite sides of the shaft from the tracks 712/713. In this embodiment the signals from the force sensitive regions have the same sign for bending moments as the stress vectors are of opposite sign on the two sides of the shaft. The signals have the same sign for torque forces.

Ideally, to obtain the best signals representative of torque and bending moments it is preferred to subtract the two signals as indicated above, although this is not required. However, this subtraction does beneficially reduce the effects of any common mode signals and therefore provides a more accurate result. For example, external magnetic field effects are cancelled using this differential analysis.

Although the tracks 706, 707, 708, 709, 710, 711, 712 and 713 are illustrated as included relative to a rotational axis of the shaft 724 in FIGS. 19 and 20, this orientation is not required.

Relatively short magnetic tracks are illustrated in FIGS. 19 and 20. However, in another embodiment these tracks can be made longer and may span about one 180 degrees of the shaft circumference, as illustrated in FIG. 18.

FIG. 22 depicts a shaft 803 and two oppositely disposed sensors 805 and 807. Bending moments in a plane spanning between the two sensors 805 and 807 and including the shaft's axis generate a signal at each sensor, but the signals are of opposite polarity. Thus combining/adding the two signals effectively subtracts the two signals with a result of zero. For a torque, the two signals from opposite sides of the shaft both increase or decrease in magnitude (depending on the direction of the torque) and combining/adding the two signals yields a positive (or negative) total value. The combined signal can be averaged to determine the average torque exerted on the shaft. Thus at least two sensors are required to discriminate the bending and torque forces. As known by those skilled in the art, these same methods are employed with strain gauge sensors.

One embodiment employs three fixed sensors, a sensor at each of 0, 120 and 240 degrees around the circumference of the shaft. Preferably, the shaft is encoded with three track clusters, each cluster comprising four tracks as illustrated in FIGS. 19 and 20. This embodiment can resolve both bending and torque forces.

In another embodiment four sensors are employed and mounted at 0, 90, 120 and 270 and four track sections, each section again comprising four tracks as illustrated in FIGS. 19 and 20. This embodiment simplifies resolution of the signals into the Cartesian coordinate system, provides better cancellation of any external magnetic fields, and improved the ability to distinguish bending moments and torque. In applications where bending moments cannot be exerted along the full length of the shaft (for example, because the drive shaft supports are firmly anchored), one magnetic field array or scanner is sufficient.

For an embodiment in which the sensors are mounted on the shaft and rotate with the shaft, the orientation of the shaft relative to the stationary mounting system must be determined to transform the rotating shaft's X and Y coordinates to the stationary system's X and Y axis.

Generally, the angular position of a shaft can be determined by the axial position of one of the two magnetic tracks that span 180 degrees around the shaft. In an embodiment employing a spiral track pattern as in FIG. 11 and a fixed sensor, detection of a shaft rotational position can be determined when a peak in the magnetic field (disposed at a predetermined marker location on the spiral track) passes the magnetic field sensor.

The rotational speed can be determined by the speed of the circumferential movement of distinct track features (e.g., magnetic field markers) or the time between successive passes of these features across the sensor. By using a third non-tilted reference track normal to the shaft axis in a circumferential direction, the axial position of the shaft can also be determined to eliminate any artifacts caused by axial displacement of the shaft. Each of these operational parameters can be determined simultaneously and under both static and dynamic operating conditions, i.e. a rotating shaft or non-rotating shaft.

The present invention replaces several monitoring instruments commonly applied to rotating machinery with one instrument. As the present invention requires no mechanical alterations to the shaft, implementation of the invention is at a relatively low cost. Further, the present invention offers certain advantages of the sectional magnetic encoding scheme, while also providing shaft position and shaft speed information.

As described above, using two spiral magnetic encoded regions with gaps in the encoded pattern of the first spiral covered by a second encoded spiral pattern that is shifted relative to the first pattern, a continuous readout of torque can be achieved with two magnetic field sensors targeting the two encoded tracks.

Because of the sectional encoding scheme of the present invention, the electrical currents, power and voltages needed for the encoding process are independent of the diameter of the shaft. The method of the present invention is therefore suitable for both small diameter shafts, e.g. 60 mm, and large diameter shafts, e.g., a wind turbine low speed shaft with a diameter of about 750 mm.

By encoding a closely-spaced pattern of axially aligned or tilted encoded sections around the shaft, a virtual magnetic gearwheel can be encoded on the shaft, allowing measurement of the speed of rotation. If two such virtual magnetic gearwheels are encoded spaced a certain distance apart, the phase difference of the acquired signals represents the twisting of the shaft between the two gearwheels being representative of the torque.

The various described embodiments have all the advantages of the prior art sectional magnetic encoding schemes, but importantly allow continuous readout of torque for large diameter shafts independent of the shaft diameter. The continuous scheme enables continuous readout of torque from DC to high frequencies. In contrast, the prior art sectional encoding schemes provide a continuous torque readout only when a sensor is mounted on the shaft and rotates with the shaft. But this prior art technique, unlike the refinements described in the present invention, requires either a noncontact wireless data and power transmission system or a slip ring. Without these noncontact readout schemes, the prior art system provides a torque readout only each time a section of the shaft passes the stationary sensor. Such a scheme is not considered continuous torque readout and is of limited use for low speed shaft systems that are impacted by higher frequency dynamic affects.

Although the magnetic regions on the shaft have been represented by elongated areas in the Figures of the present application, in fact a magnetic region of arbitrary shape within the limits of electrode design and laws of physics can be formed according to the present invention. The shape of the region depends on the shape of the electrode array, rotational motion of the shaft or electrode array between the flow of current pulses that encode the shaft, and other factors that affect magnetization of the shaft material.

While the various embodiments of the invention have been described in what is presently considered to be a preferred embodiment, many variations and modifications will become apparent to those skilled in the art. Accordingly, it is intended that the inventions not be limited to the specific illustrative embodiments but be interpreted within the full spirit and scope of the appended claims.

Although described primarily with reference to use in wind turbines, the encoding technique and encoded regions of the present invention can also be employed with shafts used in any large rotating machines, such as electric power turbines, electric power generators, turbo-machines, large electric motors, compressors, transportation drives, marine vessel drives, etc.

This written description of the embodiments of the invention uses examples to disclose the inventions, including the best mode, and also to enable any person skilled in the art to make and use the inventions. The patentable scope of the inventions is defined by the claims, and may include other examples that occur to those skilled in the art. Such other examples are intended to be within the scope of the claims if they have structural elements or process steps that do not differ from the literal language of the claims, or if they include equivalent structural elements or process steps with insubstantial differences from the literal language of the claims.

What is claimed is:

1. A magnetically spirally encoded shaft, comprising
   a first band comprising first magnetically encoded regions having a first magnetic polarity alternating with second magnetically encoded regions having a second magnetic polarity;
   a second band comprising the second magnetically encoded regions alternating with the first magnetically encoded regions, wherein the first band is spaced apart from the second band such that first magnetically encoded regions in the first band are opposite second magnetically encoded regions in the second band and second magnetically encoded regions in the first band are opposite first magnetically encoded regions in the second band, a force-sensitive region between the first and second magnetically encoded regions, magnetic fields present above each force-sensitive region;
   wherein the first and second bands are disposed in a spiral shape around a shaft circumference;
   a third band comprising the first magnetically encoded regions alternating with the second magnetically encoded regions;
   a fourth band comprising the second magnetically encoded regions alternating with the first magnetically encoded regions, wherein the third band is spaced apart from the fourth band such that first magnetically encoded regions in the third band are opposite second magnetically encoded regions in the fourth band and second magnetically encoded regions in the third band are opposite first magnetically encoded regions in the fourth band, force sensitive regions between the first and second magnetically encoded regions of the third and fourth bands;
   wherein the first band defines first dead zones between each of the first and second magnetically encoded regions aligned with second dead zones between each of the first and the second magnetically encoded regions in the second band, wherein each of the first and the second dead zones is axially aligned with a force-sensitive region between the third and fourth bands; and wherein the third band defines third dead zones between each of the first and second magnetically encoded regions axially aligned with fourth dead zones between each of the second and first magnetically encoded regions in the fourth band, wherein each of the third and fourth dead zones are axially aligned with a force-sensitive region between the first and second bands, the shaft for use with a first fixed magnetic field sensor for detecting magnetic fields in the force-sensitive regions.

2. The magnetically spirally encoded shaft of claim 1 for determining rotational speed of the shaft responsive to one of a time interval between successive detections of the magnetic field by the first sensor and a shaft diameter and a speed at which the first and second bands pass a sensor array in an axial or a tangential direction.

3. The magnetically spirally encoded shaft of claim 1 wherein the first sensor comprises a magnetic field scanner or a magnetic field sensor array.

4. The magnetically spirally encoded shaft of claim 1 for determining a shaft rotational position responsive a magnetic field marker as detected by the first sensor.

5. The magnetically spirally encoded shaft of claim 1 further comprising a second sensor disposed on an opposite side of the shaft from the first sensor.

6. The magnetically spirally encoded shaft of claim 5 wherein for torque magnetic fields detected by the first and second sensors both increase or both decrease in magnitude.

7. The magnetically spirally encoded shaft of claim 5 wherein magnetic fields detected by the first and second sensors discriminate bending forces and torque forces exerted on the shaft.

8. The magnetically spirally encoded shaft of claim 1 further comprising a second sensor, wherein the force-sensitive region between the first and the second magnetically encoded regions comprises a first polarity force-sensitive region defined by the first magnetically encoded region on the left of the second magnetically encoded region and defines a second polarity force-sensitive region defined by the first magnetically encoded region on the right of the second magnetically encoded region; and the first and second sensors for producing respective first and second signals responsive to a magnetic field of the respective first and second polarity force-sensitive regions, the first and second force-sensitive regions altered by a respective first force through the first polarity force-sensitive region and a second force through the second polarity force-sensitive region, the first signal opposite in sign from the second signal.

9. The magnetically spirally encoded shaft of claim 8 wherein the first signal is combined with the second signal for determining forces applied to the shaft, the forces comprising, torque forces, bending forces, stress forces and strain forces.

10. The magnetically spirally encoded shaft of claim 1 wherein the force-sensitive region between the first and second bands is maximally sensitive to force components perpendicular to the first and second magnetically encoded regions of the first and second bands and minimally sensitive to force components parallel to the first and second magnetically encoded regions of the first and second bands.

11. The magnetically spirally encoded shaft of claim 1 wherein a material of the shaft comprises one of 34CrNiMo8, 50NiCrI3, 4CrNi13-4, 5CrNiCuNb16-4 and 30CrNiMo8.

12. The magnetically spirally encoded shaft of claim 1 wherein the shaft is disposed in a wind turbine and driven by wind turbine rotor blades in mechanical communication with the shaft.

13. The magnetically spirally encoded shaft of claim 1 wherein the shaft is disposed in an electric power turbine or in an electric power generator.

14. The magnetically spirally encoded shaft of claim 1 further comprising a second sensor, the first and second sensors disposed on opposite sides of the shaft and cooperating to provide a continuous sensing of the magnetic field completely around a shaft circumference.

15. The magnetically spirally encoded shaft of claim 1 for use as a magnetic gearwheel.

16. A magnetically spirally encoded shaft, comprising
a first band comprising first magnetically encoded regions having a first magnetic polarity alternating with second magnetically encoded regions having a second magnetic polarity;
a second band comprising the second magnetically encoded regions alternating with the first magnetically encoded regions, wherein the first band is spaced apart from the second band such that first magnetically encoded regions in the first band are opposite second magnetically encoded regions in the second band and second magnetically encoded regions in the first band are opposite first magnetically encoded regions in the second band, a force-sensitive region between the first and second magnetically encoded regions, magnetic fields present above each force-sensitive region;
wherein the first and second bands are disposed in a spiral shape around a shaft circumference;
a third band further comprising first magnetically encoded regions alternating with second magnetically encoded regions;
a fourth band further comprising the second magnetically encoded regions alternating with the first magnetically encoded regions, wherein the third band is spaced apart from the fourth band such that first magnetically encoded regions in the third band are opposite second magnetically encoded regions in the fourth band and second magnetically encoded regions in the third band are opposite first magnetically encoded regions in the fourth band, magnetic fields present above each force-sensitive region between the first and the second magnetically encoded regions;
wherein the third and fourth bands are disposed in one of a circumferential orientation relative to the shaft circumference,
the shaft for use with a first fixed magnetic field sensor for detecting magnetic fields in the force-sensitive regions.

17. A magnetically spirally encoded shaft and magnetic field detecting system, comprising:
first, second, third and fourth magnetically encoded bands spirally encircling the shaft, each band comprising first magnetically encoded regions having a first magnetic polarity alternating with second magnetically encoded regions having a second magnetic polarity;
first, second, third and fourth dead zones defined in each band between successive first and second magnetically encoded regions;
the first and second bands spaced apart by a first distance and the third and fourth bands spaced apart by the first distance, a second distance greater than the first distance between the first and third and bands and between the second and the fourth bands;

first magnetically encoded regions opposite second magnetically encoded regions in the first and second bands and defining a first force-sensitive region therebetween;

first magnetically encoded regions opposite second magnetically encoded regions in the third and fourth bands and defining a second force-sensitive region therebetween;

the first force-sensitive regions spaced opposite first and second dead zones in the third and fourth bands;

the second force-sensitive regions spaced opposite third and fourth dead zones in the first and second bands; and sensors mounted proximate the shaft for detecting magnetic fields surrounding the first and second force-sensitive regions, wherein a force exerted on one or both of the first and second force-sensitive regions alters the magnetic field surrounding the respective first and second force-sensitive regions, the alterations indicative of the force exerted.

* * * * *

UNITED STATES PATENT AND TRADEMARK OFFICE
CERTIFICATE OF CORRECTION

| | | |
|---|---|---|
| PATENT NO. | : 8,203,334 B2 | Page 1 of 1 |
| APPLICATION NO. | : 12/914322 | |
| DATED | : June 19, 2012 | |
| INVENTOR(S) | : Baller et al. | |

It is certified that error appears in the above-identified patent and that said Letters Patent is hereby corrected as shown below:

Title Page, Item (54) and Column 1, Line 3, in Title, delete "ANGEL," and insert -- ANGLE, --, therefor.

Title Page, Item (56), Under "OTHER PUBLICATIONS", delete "Magnetorestrictive" and insert -- Magnetostrictive --, therefor.

In Column 9, Line 40, delete "306C." and insert -- 308C. --, therefor.

In Column 15, Line 12, delete "418E" and insert -- 418B --, therefor.

In Column 22, Line 66, in Claim 17, delete "and bands" and insert -- bands --, therefor.

Signed and Sealed this
Twenty-fourth Day of July, 2012

David J. Kappos
*Director of the United States Patent and Trademark Office*